(12) United States Patent
Hsiao et al.

(10) Patent No.: US 6,702,003 B2
(45) Date of Patent: Mar. 9, 2004

(54) THREE-PHASE HEAT TRANSFER STRUCTURE

(75) Inventors: Feng-Neng Hsiao, Taipei (TW); Meng-Cheng Huang, Banchiau (TW)

(73) Assignee: Quanta Computer Inc., Tao Yuan Shien (TW)

( * ) Notice: Subject to any disclaimer, the term of this patent is extended or adjusted under 35 U.S.C. 154(b) by 0 days.

(21) Appl. No.: 10/269,965

(22) Filed: Oct. 15, 2002

(65) Prior Publication Data

US 2003/0221812 A1 Dec. 4, 2003

(30) Foreign Application Priority Data

May 31, 2002 (TW) ........................................ 91208060 U

(51) Int. Cl.[7] ................................................. F28F 7/00
(52) U.S. Cl. ................................. 165/80.3; 165/104.33; 165/104.21; 165/185; 165/902; 361/700; 361/704; 361/708
(58) Field of Search ................. 165/80.3, 104.21, 165/104.26, 10, 902, 104.33, 185; 361/700, 704–706, 707–710; 257/714, 715; 174/15.3, 16.2

(56) References Cited

U.S. PATENT DOCUMENTS

| | | | | |
|---|---|---|---|---|
| 5,007,478 A | * | 4/1991 | Sengupta | 165/104.33 |
| 5,937,937 A | * | 8/1999 | Sehmbey et al. | 165/104.33 |
| 6,191,944 B1 | * | 2/2001 | Hammel et al. | 165/104.33 |
| 6,260,613 B1 | * | 7/2001 | Pollard, II | 165/185 |

FOREIGN PATENT DOCUMENTS

| | | | | |
|---|---|---|---|---|
| DE | 19628545 | * | 1/1998 | 165/104.33 |
| EP | 881675 | * | 12/1998 | 165/104.33 |

* cited by examiner

Primary Examiner—Christopher Atkinson
(74) Attorney, Agent, or Firm—Browdy and Neimark

(57) ABSTRACT

A three-phase heat transfer structure includes a heat conducting plate, a heat sink mounted on the heat conducting plate near one end, a thermal tube embedded in and extended through two distal ends of the heat conducting plate, and a phase change material filled in recessed receiving spaces in the heat conducting plate near one end remote from the heat sink and adapted to accumulate heat energy absorbed by the heat conducting plate from a heat source.

6 Claims, 5 Drawing Sheets

THREE-PHASE HEAT TRANSFER STRUCTURE

BACKGROUND OF THE INVENTION

1. Field of the Invention

The present invention relates to heat transfer means and, more particularly, to a three-phase heat transfer structure, which uses phase change material to store excessive amount of heat energy, enabling heat to be smoothly dissipated when the environmental temperature lowered.

2. Description of the Related Art

Following fast development of computer industry, a variety of high-precision electronic devices have been continuously created. These high-precision electronic devices achieve high operation speed, however they release high heat during operation. In order to keep high-precision electronic devices functioning normally, the surrounding temperature must be maintained within the acceptable working range. Various cooling arrangements have been disclosed employing thermal tube technology. A thermal tube has a wick structure on the inside for quick transfer of a working fluid to carry heat from a heat source, for example, a CPU or power transistor to a heat sink.

FIG. 1 illustrates a cooling structure 1a according to the prior art. The cooling structure 1a comprises a heat conducting plate 10a extruded from metal (for example, aluminum), a heat sink 11a extruded from metal (for example, aluminum) and mounted on the top sidewall of the heat conducting plate 10a near one end, and a plurality of thermal tubes 13a provided on the bottom side of the heat conducting plate 10a. The heat sink 11a comprises a plurality of upright radiation fins 12a arranged in parallel. The thermal tubes 13a are made of copper, having a wick structure and a working fluid on the inside. When in use, the thermal tubes 13a are connected to the heat source (CPU or power transistor) to absorb heat from the heat source, enabling heat to be further dissipated into the air through the radiation fins 12a of the heat sink 11a. This design of cooling structure 1a is still not satisfactory in function. Because an advanced CPU produces high heat during its operation, the heat dissipation speed of the solid heat sink 11a and the solid heat conducting plate 10a is lower than the heat producing speed of an advanced CPU. Therefore, the aforesaid conventional cooling structure 1a cannot satisfy the need.

SUMMARY OF THE INVENTION

The present invention has been accomplished under the circumstances in view. It is therefore the main object of the present invention to provide a three-phase heat transfer structure, which uses a phase change material to store heat energy and to change the phase from solid state to liquid state when absorbed a certain amount of heat energy, enabling absorbed heat energy to be smoothly dissipated into the air when the surrounding temperature lowered. It is another object of the present invention to provide a three-phase heat transfer structure, which prevents breakdown of the computer system due to excessive high temperature. To achieve these and other objects of the present invention, the three-phase heat transfer structure comprises a heat conducting plate disposed in contact with a heat source for absorbing heat energy from the heat source, a heat sink mounted on the heat conducting plate near one end, and at least one thermal tube embedded in the heat conducting plate and extended through two distal ends of the heat conducting plate, each thermal tube having a wick structure and a working liquid on the inside. The heat conducting plate comprises at least one recessed receiving space in the top side near one end remote from the heat sink, and a phase change material filled in the at least one recessed receiving space. The phase change material changes the phase from solid state to liquid state when storing heat energy absorbed through the heat conducting plate. When the environmental temperature lowered, the phase change material is returned to solid state.

DETAILED DESCRIPTION OF THE PREFERRED EMBODIMENT

Figure 1:
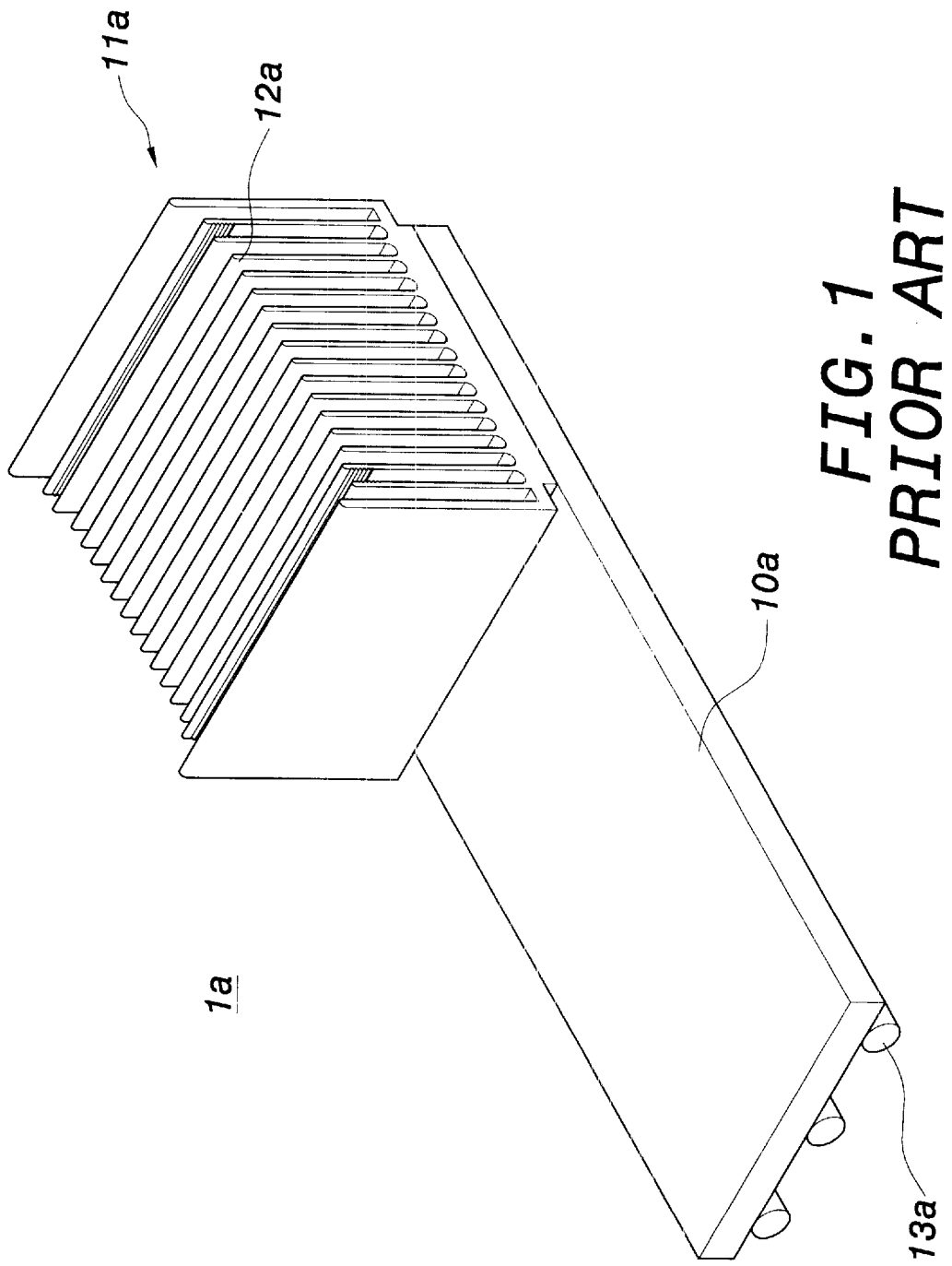
FIG. 1 is an elevational view of a cooling structure constructed according to the prior art.
Figure 2:
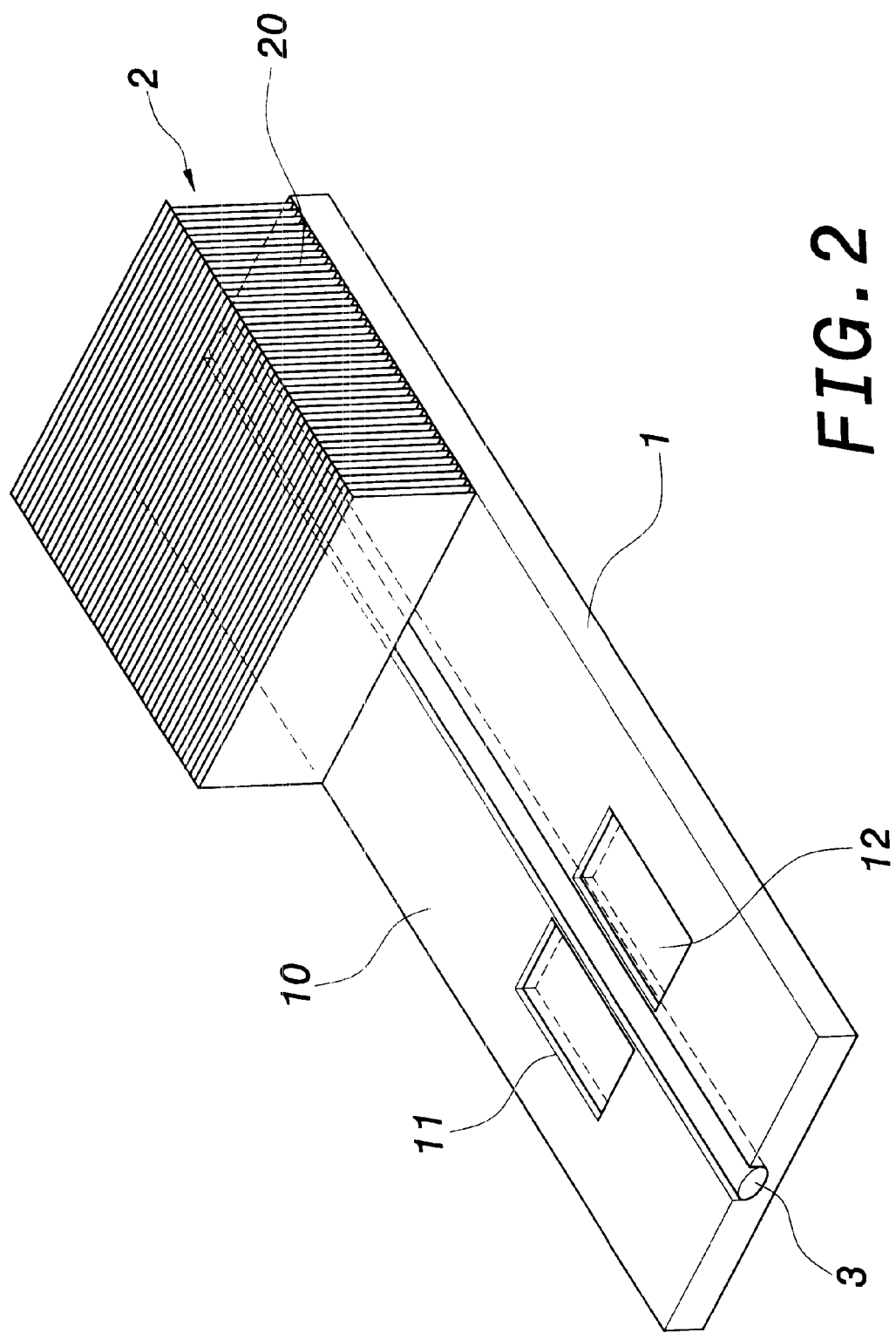
FIG. 2 is a perspective view of a three-phase heat transfer structure according to the present invention.
Figure 3:
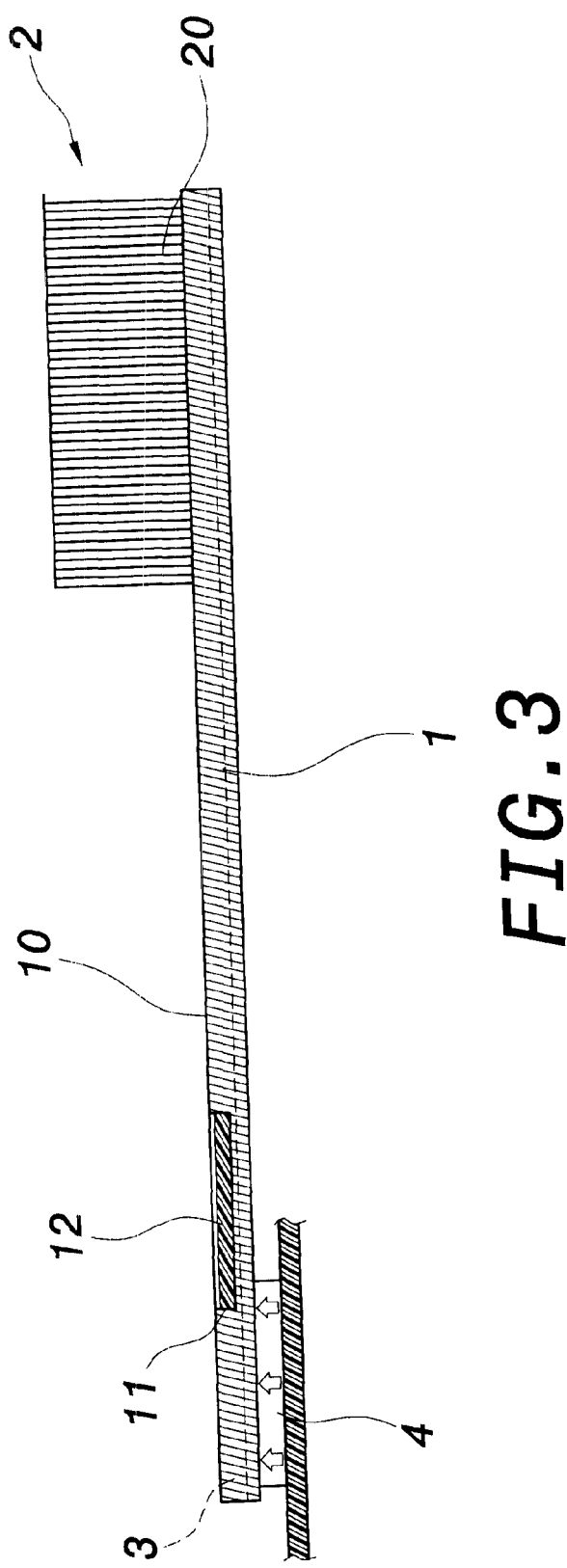
FIG. 3 is a sectional view of the three-phase heat transfer structure according to the present invention.

Referring to FIGS. 2 and 3, a three-phase heat transfer structure in accordance with the present invention is shown comprised of a heat conducting plate 1, a heat sink 2, and a thermal tube 3.

The heat conducting plate 1 is made of heat conducting metal (aluminum or copper). The heat conducting plate 1 can be made in any of a variety of shapes. According to this embodiment, the heat conducting plate 1 is shaped like a flat panel, having a plurality of recessed receiving spaces 11 in a top sidewall 10 and a solid-vapor or solid-liquid phase change material 12 filled in the recessed receiving spaces 11. The phase change material 12 can be obtained from paraffin wax or grease that changes the phase with surrounding temperature (it is maintained in solid state at room temperature, and changed to liquid state when hot, and returned to solid state when cooled down). The recessed receiving spaces 11 are provided in a particular area in the heat conducting plate 1. It is not necessary to provide the recessed receiving spaces 11 over the whole area of the heat conducting plate 1.

The heat sink 2 is composed of a plurality of radiation fins 20 transversely arranged in parallel and fixedly fastened to the top sidewall 10 of the heat conducting plate 1 near one end remote from the recessed receiving spaces 11. The heat sink 2 is made of heat conducting metal (for example, aluminum or copper). Further, a fan (not shown) may be provided at the top side of the heat sink 2 and controlled to cause currents of air toward the gaps in between the radiation rings 20.

The thermal tube 3 is a heat conducting metal tube made of, for example, copper for liquid-vapor phase change heat transfer, having a wick structure and a working fluid on the inside. The capillary effect of the wick structure of the thermal tube 3 facilitates the transmission of the working fluid. The thermal tube 3 is embedded in the top sidewall 10 of the heat conducting plate 1, and extended between the two distal ends of the heat conducting plate 1 for transferring heat from the heat conducting plate 1 to the heat sink 2 for quick dissipation into the air.

Figure 4:
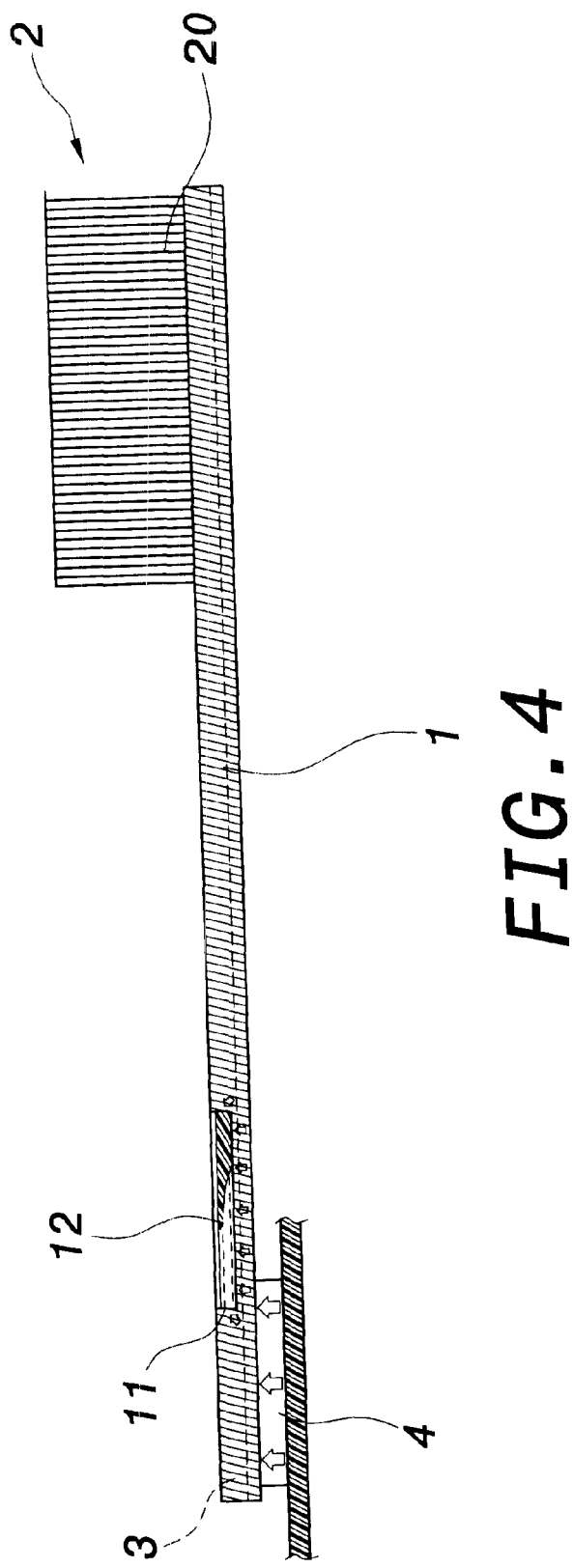
FIG. 4 is a sectional view showing one operation status of the three-phase heat transfer structure according to the present invention.
Figure 5:
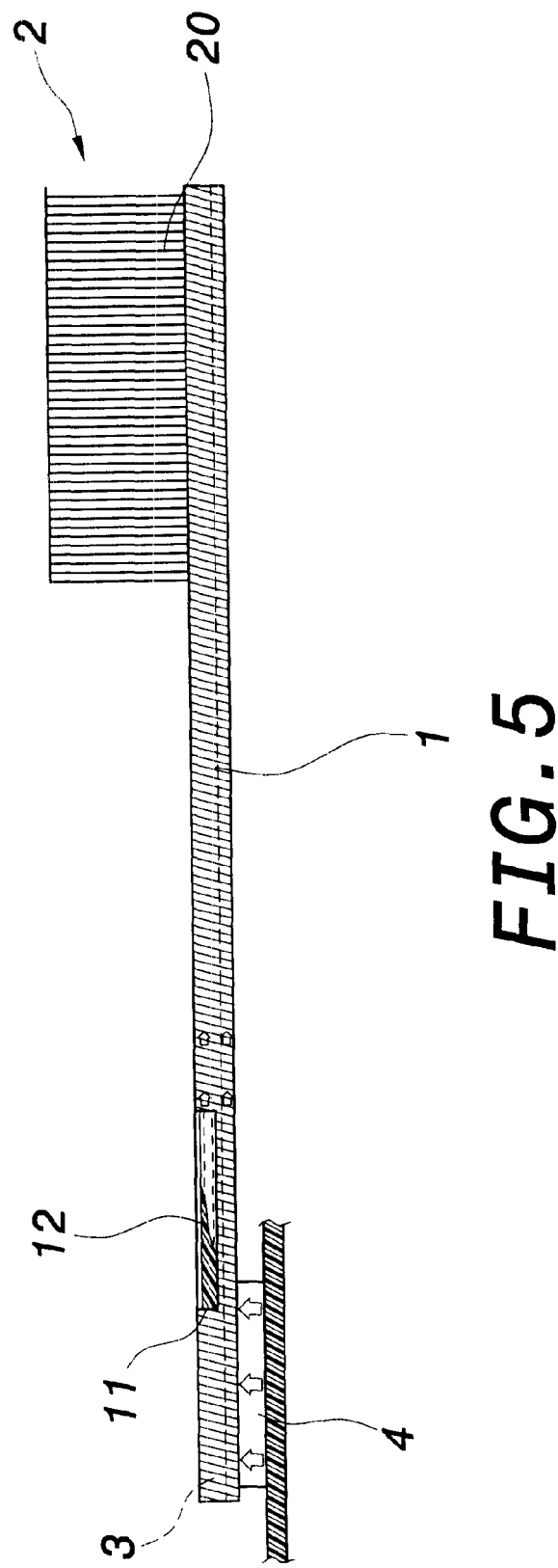
FIG. 5 is a sectional view showing another operation status of the three-phase heat transfer structure according to the present invention.

Referring to FIGS. 4 and 5, when in use, the heat conducting plate 1 is supported on the heat source (for example, a CPU or power transistor) 4 to absorb heat from the heat source 4. The phase change material 12 accumulates heat energy absorbed by the heat conducting plate 1 from the heat source 4, preventing damage of the heat source 4 due to "thermal shock". When the heat produced by the heat source 4 continuously increased, the phase change material 12 absorbs and stores heat energy from the heat source 4 and changes from solid state to liquid state after absorption of a certain amount of heat energy, preventing accumulation of heat energy at the heat source 4. Therefore, the heat source 4 is maintained functioning normally. When the phase change material 12 absorbing and storing heat energy from the heat source 4, the heat conducting plate 1 and the thermal tube 3 continuously transfer heat to the heat sink 2, enabling heat to be quickly dissipated into the air through the radiation fins 20. When the temperature of the heat source 4 lowered, the phase change material 12, the heat conducting plate 1 and the thermal tube 3 keep transferring heat to the heat sink 2 to lower the temperature of the phase change material 12, thereby causing the phase change material 12 to return to solid state.

A prototype of three-phase heat transfer structure has been constructed with the features of the annexed drawings of FIGS. 2~5. The three-phase heat transfer structure functions smoothly to provide all of the features discussed earlier.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A three-phase heat transfer structure comprising:
   a heat conducting plate with a bottom side disposed in contact with a heat source for absorbing heat energy from the heat source and having at least one recessed receiving space formed in a top side thereof;
   a phase change material, which is in a solid state at room temperature, filled in the at least one recessed receiving space;
   a heat sink mounted on the top side of the heat conducting plate near an end of the heat conducting plate, and
   a least one thermal tube embedded in the heat conducting plate, and extended through two distal ends of the heat conducting plate to respectively connect the at least one recessed receiving space and the heat sink.

2. The three-phase heat transfer structure as claimed in claim 1, wherein said phase change material is paraffin wax.

3. The three-phase heat transfer structure as claimed in claim 1, wherein said phase change material is grease.

4. The three-phase heat transfer structure as claimed in claim 1, wherein said phase change material connects said thermal tube.

5. The three-phase heat transfer structure as claimed in claim 1, wherein said thermal tube crosses said recessed receiving space.

6. A three-phase heat transfer structure comprising:
   a heat conducting plate with two distal ends, a top side and a bottom side disposed in contact with a heat source for absorbing heat energy from the heat source;
   a heat sink mounted on the top side of the heat conducting plate near one of the two distal ends of the heat conducting plate;
   at least one thermal tube embedded in the heat conducting plate, and extended through the two distal ends of the heat conducting plate;
   at least one recessed receiving space in the heat conducting plate and having an open top side, and connected to the thermal tube; and
   a phase change material within the recessed receiving space, for absorbing excess heat energy from the heat source to the heat conducting plate and at least one thermal tube, and wherein said phase change material is in a solid state at room temperature.

\* \* \* \* \*